(12) United States Patent
Chandran

(10) Patent No.: US 7,202,420 B2
(45) Date of Patent: Apr. 10, 2007

(54) METHODS TO PREVENT MECHANICAL FLEXURE RELATED BGA FAILURE

(75) Inventor: Biju I. Chandran, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 360 days.

(21) Appl. No.: 10/738,688

(22) Filed: Dec. 16, 2003

(65) Prior Publication Data

US 2005/0126819 A1    Jun. 16, 2005

(51) Int. Cl.
*H05K 7/12* (2006.01)
*H05K 7/20* (2006.01)

(52) U.S. Cl. .................. 174/260; 257/718; 257/719; 257/727; 257/778; 438/108; 438/122; 29/830; 29/832

(58) Field of Classification Search .............. None
See application file for complete search history.

(56) References Cited

U.S. PATENT DOCUMENTS

| | | | |
|---|---|---|---|
| 5,990,552 A * | 11/1999 | Xie et al. .................. 257/718 |
| 6,349,032 B1 * | 2/2002 | Chan et al. ............... 361/704 |
| 6,441,485 B1 * | 8/2002 | Glenn ....................... 257/727 |
| 6,724,081 B2 * | 4/2004 | Ho et al. ................... 257/718 |
| 6,750,551 B1 * | 6/2004 | Frutschy et al. .......... 257/785 |
| 6,836,005 B2 * | 12/2004 | Moriwaki ................. 257/678 |
| 2003/0150645 A1 * | 8/2003 | Chiu ......................... 174/264 |
| 2004/0010911 A1 * | 1/2004 | Kung et al. ................ 29/832 |

\* cited by examiner

*Primary Examiner*—John B. Vigushin
(74) *Attorney, Agent, or Firm*—Kathy J. Ortiz

(57) ABSTRACT

Methods and associated apparatus of reducing stress in a package are described in which a package is provided comprising an array of interconnects that are connected to a substrate, and then reducing the stress of the interconnects located near a weak area in the package, during flexure of the substrate, by spring loading the weak area of the package.

17 Claims, 13 Drawing Sheets

US 7,202,420 B2

METHODS TO PREVENT MECHANICAL FLEXURE RELATED BGA FAILURE

FIELD OF THE INVENTION

The present invention relates to the field of microelectronic packaging, and more particularly to methods of improving ball grid array reliability.

BACK GROUND OF THE INVENTION

Microelectronic devices are typically assembled into packages that are then mounted onto a substrate, such as a printed circuit board (PCB). Ball grid array (BGA) packages are a type of common surface mount chip package that may typically include an array of interconnects (such as solder balls, or conductive polymers, for example) that electronically connect the microelectronic device to a substrate.

During subsequent processing and handling (i.e. in-circuit, and functional testing of the substrate, manual testing during system assembly, customer handling etc.) of a BGA package 510 (see FIG. 5a) that has been mounted to a substrate 530, the substrate 530 may undergo flexure due to such events as mechanical stress and temperature change, for example. This flexure may cause interconnects 520 located near a weak area of the BGA package 510, such as a corner of the BGA package, for example, to fail catastrophically, or to crack such that they may fail during subsequent processing and/or handling. This flexure induced mechanical failure in BGA interconnects is sometimes referred to as brittle solder joint failure.

This failure in the interconnects 520 located near a weak area may occur because the BGA package 510 and the substrate 530 may not bend as one during flexure. The BGA package 510 may tend to remain flatter when the motherboard flexes. As shown in FIG. 5b, this flexure may induce large tensile 540 and shear 550 forces in the interconnects 520, particularly in those interconnects 520 located near a weak area of the package 510.

Many attempts have been made to avoid the problem of BGA interconnects opening and cracking. Those attempts have included reducing the amount of flexure of the substrate in the area of the package, either by stiffening the local area of the substrate, or by placing heavy components away from that area. However, substrate stiffening, and selective component placement may be undesirable due to increased cost and/or lost real estate on the substrate.

Therefore, it would be desirable to prevent and/or reduce mechanical failure in interconnects within BGA packages, without utilizing valuable real estate or incurring significant cost. The methods and apparatus of the present invention greatly alleviate this failure mechanism.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
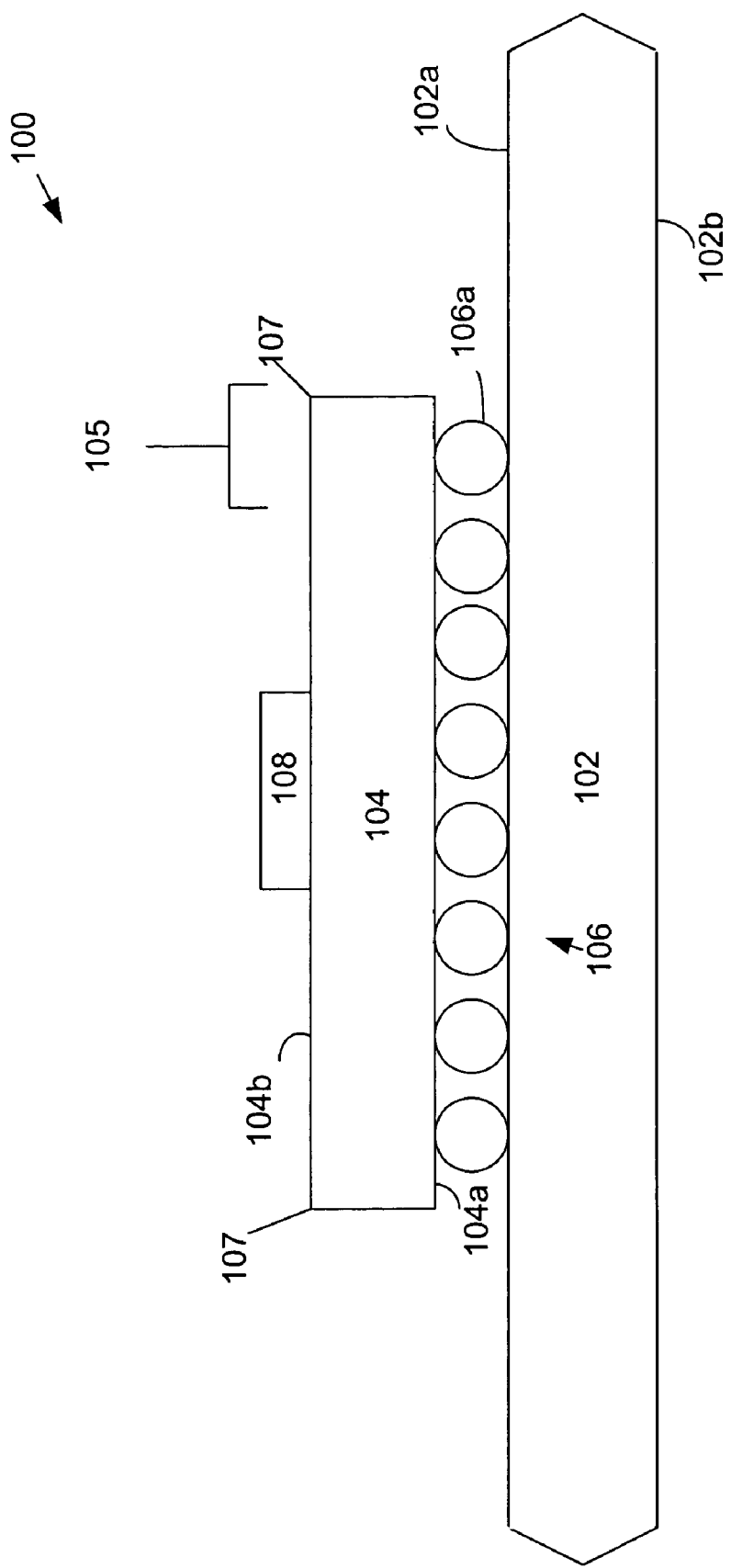
FIGS. 1a–1e represent structures according to an embodiment of the present invention.
Figure 1B:
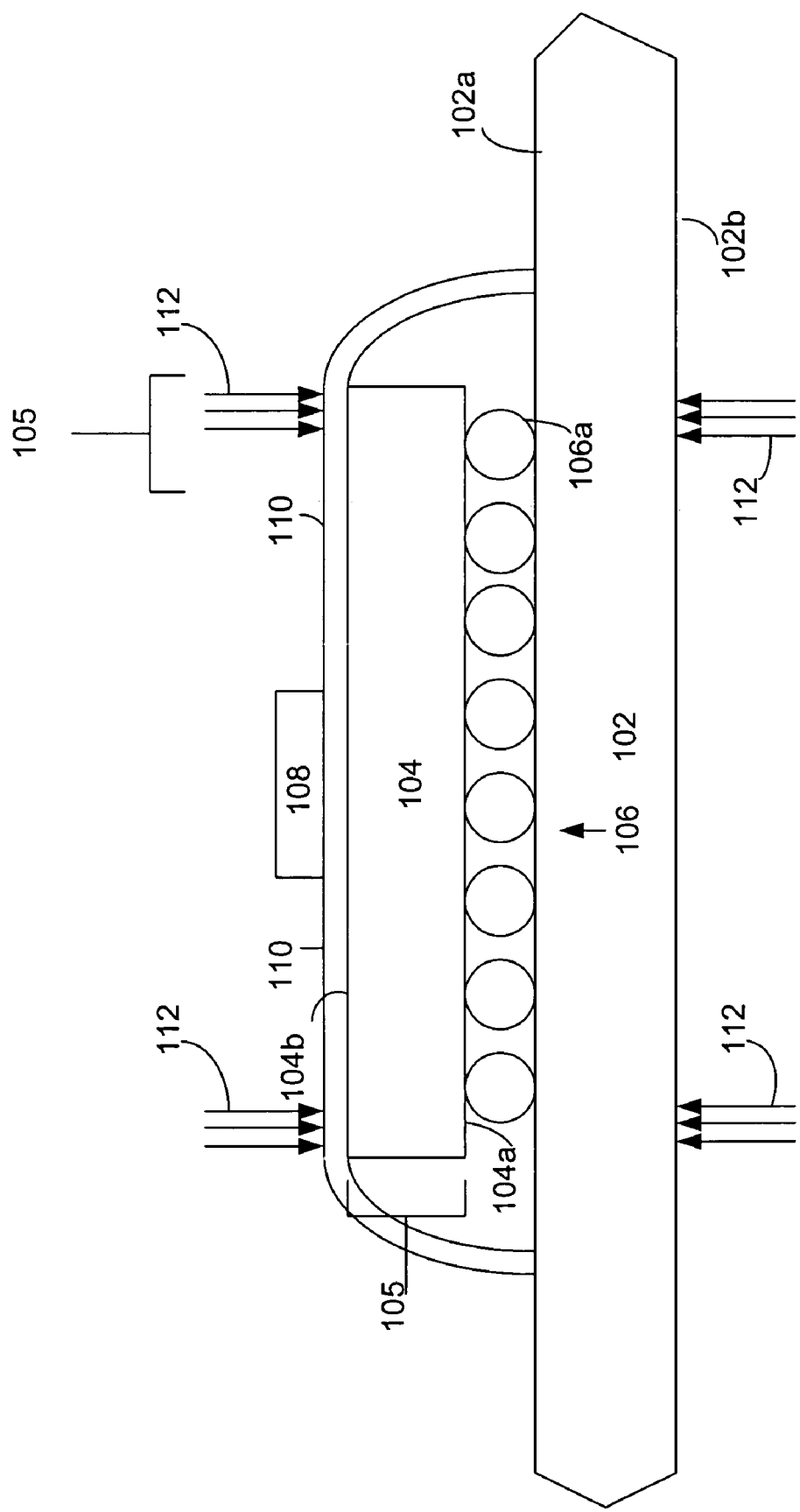

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated apparatus of reducing stress in a package are described. Those methods comprise providing a package comprising an array of interconnects that are connected to a substrate, and then reducing the stress experienced by interconnects located near a weak area of the package during flexure of the substrate, by spring loading the weak area of the package. The methods and apparatus of the present invention reduces and prevents mechanical flexure related failure in ball grid array packages.

FIGS. 1a–1d illustrate an embodiment of a method and associated structures of reducing stress in a microelectronic package according to the present invention. FIG. 1a illustrates a portion of an assembly 100 that may comprise a substrate 102, which may comprise a first surface 102a and a second surface 102b. The substrate 102 may comprise a printed circuit board, for example, or may include any such substrate that electrically connects to a package 104, such as a microelectronic package, for example. The package 104 may comprise a microelectronic device 108, such as an integrated circuit, for example. The package 104 may comprise a ball grid array (BGA) package, for example, but may comprise other types of packages that may comprise an array of interconnects such as are well known in the art.

The package 104 may comprise a first side 104a, and a second side 104b. The first side 104a may further comprise an array of interconnects 106. The array of interconnects 106 may further comprise corner interconnects 106a, i.e. interconnects that are located substantially near a corner 107 of the package 104. The array of interconnects 106 may be electrically connected to a surface of the substrate 102, shown in FIG. 1a as being connected to the first surface 102a of the substrate 102.

The package 104 may comprise a weak area 105. The weak area 105 may comprise an area of the package 104 wherein forces, such as shear and/or tensile forces that may occur during flexure of the substrate 102 (such as during assembly or handling), may act upon the weak area 105 to induce mechanical failure of the interconnects 106 within the weak area 105. In the current embodiment, the weak area 105 may comprise a corner area of the package 104, but in other embodiments may include other weak areas of the package 104, such as an edge 103 (see FIG. 1c) of the package 104.

Referring again to FIG. 1b, a spring loading mechanism 110 may be coupled to a surface of the package 104 (shown in FIG. 1b as being connected to the second surface 104b) and may also be connected to a side of the substrate 102 (shown in FIG. 1b as being connected to the first side 102a). It is to be understood that the particular location of the spring loading mechanism 110 may vary depending upon the particular application.

The spring loading mechanism 110 may, in the current embodiment, comprise a spring clip for example, as is well known in the art, but may also comprise any such mechanism that is capable of spring loading the package 104 and the array of interconnects 106 (i.e. applying a force, such as a compressive force, to the package 104 and the array of interconnects 106). In the current embodiment, the spring loading mechanism 110 may apply a force 112 to the weak area 105 of the package 104.

Figure 1C:
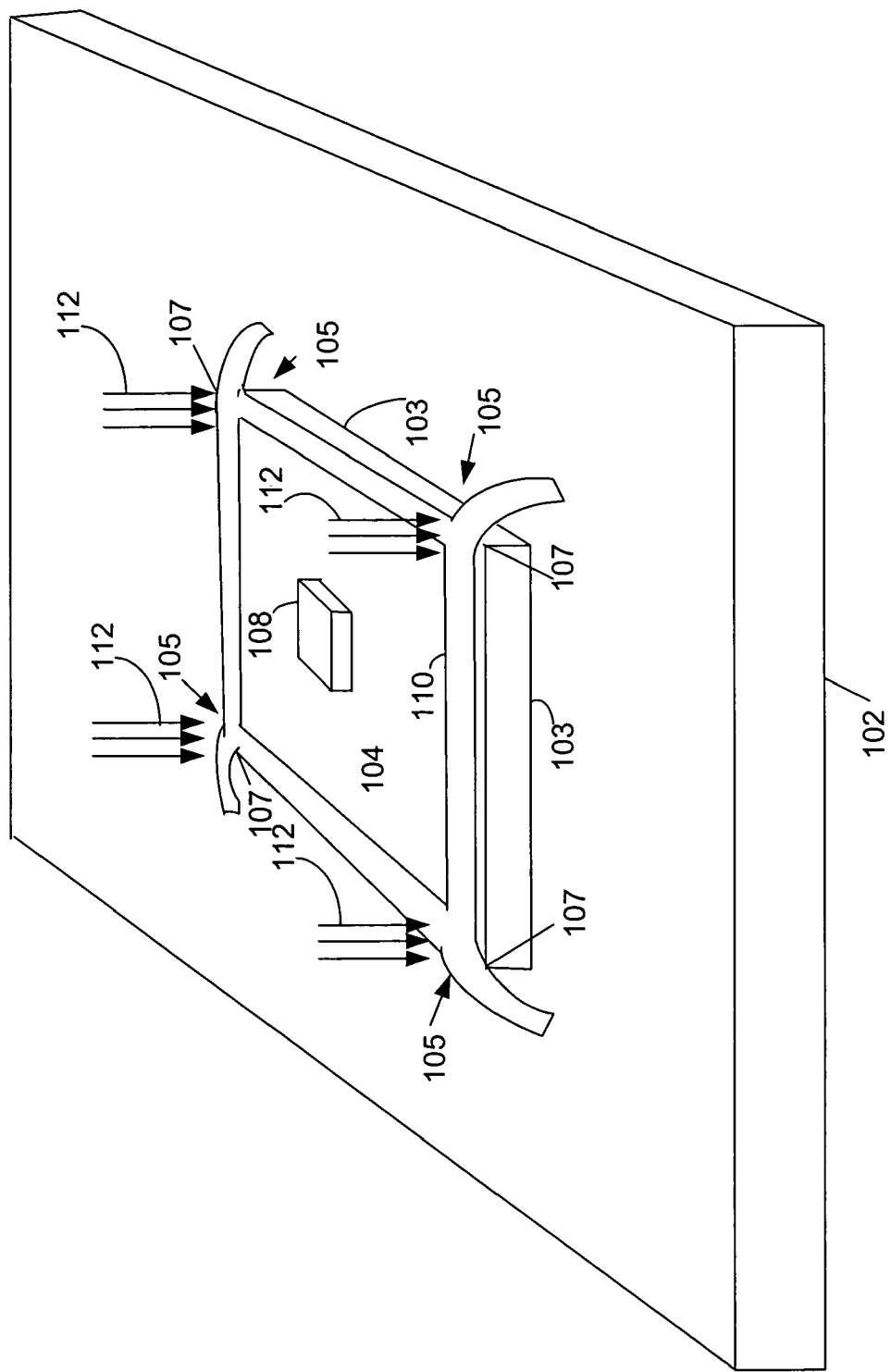
Figure 1D:
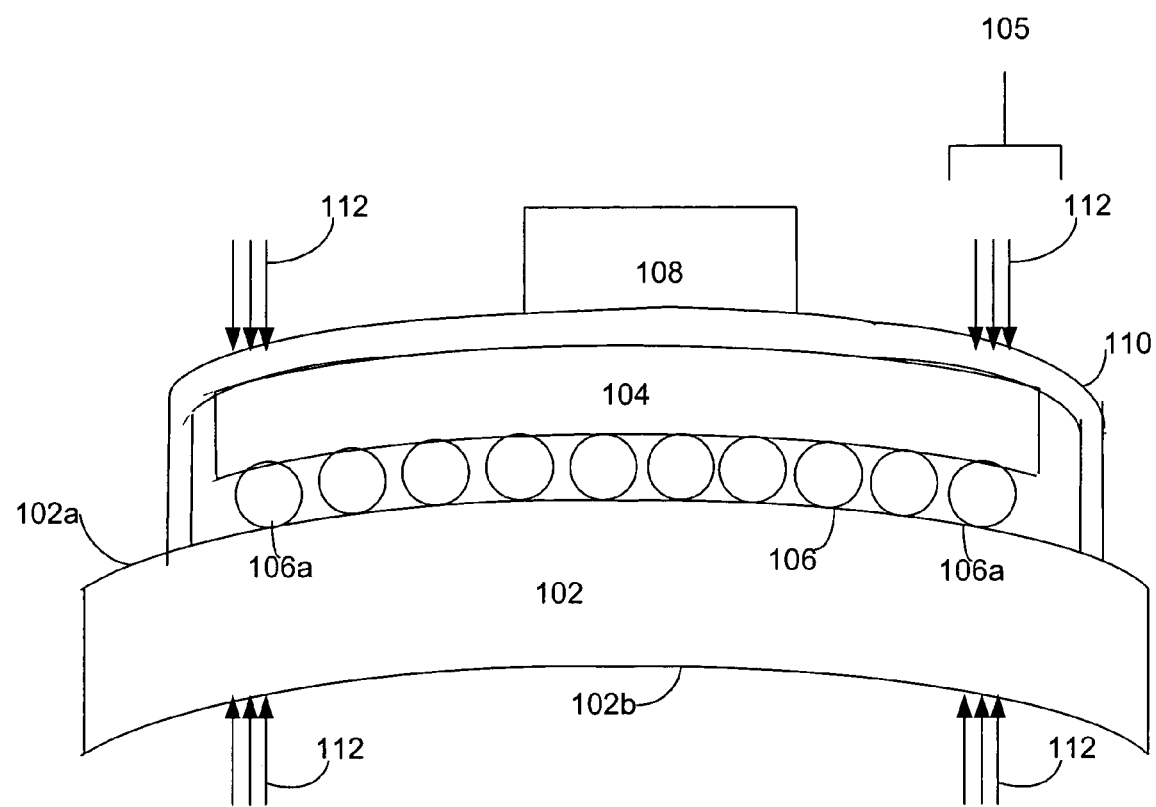

It will be understood that the package 104 may comprise various geometric configurations, and is not limited to rectangular shaped packages, such that the package 105 may comprise various other geometric configurations as well. FIG. 1c depicts a side view of a rectangular embodiment of the package 104, in which the spring loading mechanism 110 is coupled to the package 104 and to the first surface 102a of the substrate 102, and may apply a force 112 to the weak area 105, (which in this embodiment comprises the corners 107) of the package 104. In this manner, the spring loading mechanism 110 may spring load the corners of the package 104 and thus the corner interconnects 106a (see FIG. 1b).

Referring back to FIG. 1c, it will be appreciated that the edges 103 of the package 104 may also be spring loaded by the spring mechanism 110 if desired for a particular application. In fact, any area of the package 104 in which the interconnects 106 within that area of the package 104 experience mechanical failure due to flexure of the substrate 102 may be strengthened by spring loading the particular weak area 105 of the package with the spring loading mechanism 110.

During flexure of the substrate 102 (see FIG. 1d), the flexure (that may be caused by thermal expansion during various processes, such as assembly, and/or mechanical stress during handling, and/or during testing, for example) may induce forces, such as tensile and/or shear forces, upon the interconnects 106 in the weak area 105 of the package 104, shown in this embodiment as being induced in the corner interconnects 106a. By spring loading the package 104 with the spring loading mechanism 110 prior to substrate 102 flexure, the induced forces from the substrate 102 flexure may be reduced and/or eliminated, since the applied compressive force 112 may counteract the flexure induced forces.

Figure 1E:
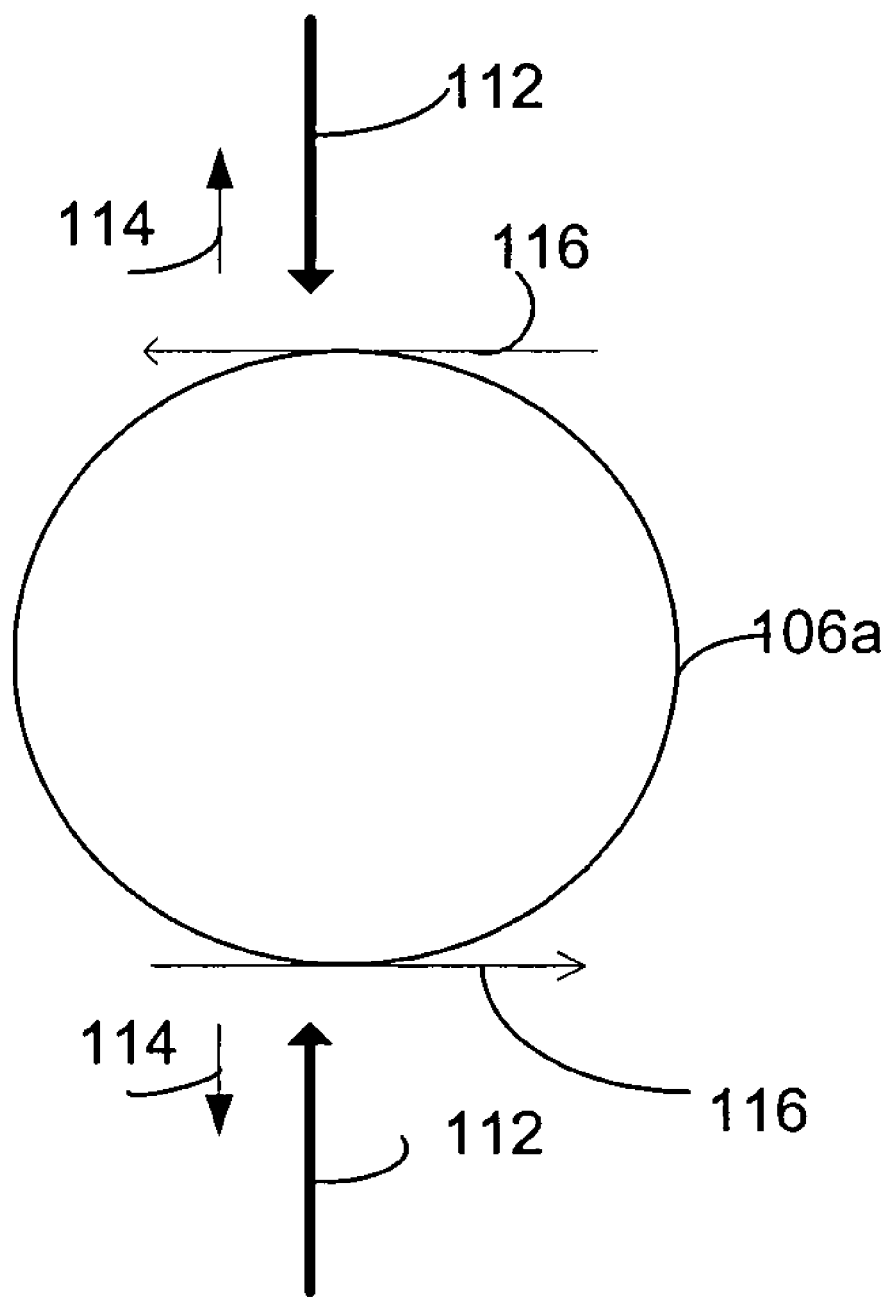

FIG. 1e depicts a corner interconnects 106a after flexure according to the current embodiment of the present invention. The induced forces that may be experienced by the interconnects during flexure may include a tensile force 114 and/or a shear force 116, as depicted in FIG. 1e. The magnitude of the force 112 may be chosen such that it reduces and/or eliminates the induced flexure forces experienced by an interconnect located near a weak area of the package, such as the corner interconnect 106a, but is not of such a magnitude that the force 112 itself causes failure in such interconnects (such as by smashing the interconnects by applying too much force, etc.). The particular magnitude of the force 112 may be tailored for the particular application parameters.

Figure 2A:
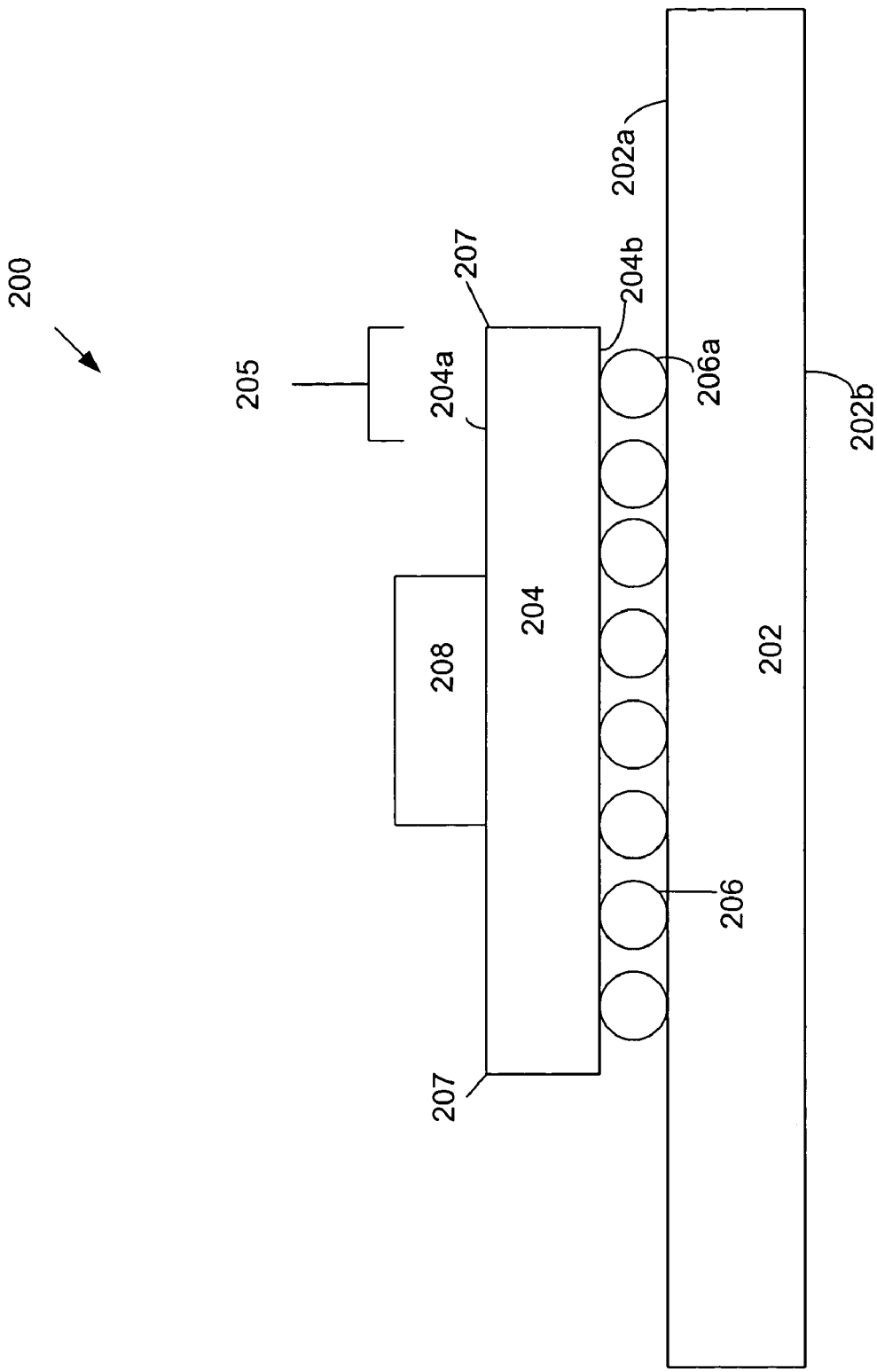
FIGS. 2a–2d represent structures according to an embodiment of the present invention.

In another embodiment, the spring loading mechanism may comprise a spring-loaded heat dissipating device. FIG. 2a depicts an assembly 200, similar to the assembly 100, that may comprise a substrate 202, and a package 204 that may be connected to the substrate 202 by an array of interconnects 206. The substrate 202 may comprise a first surface 202a and a second surface 202b. The package 204 may comprise a first side 204a and a second side 204b.

The package 204 may comprise a weak area 205 similar to the weak area 105, which in the current embodiment may comprise the corners 207 of the package 204. A microelectronic device 208 may be coupled to the package 204.

Figure 2B:
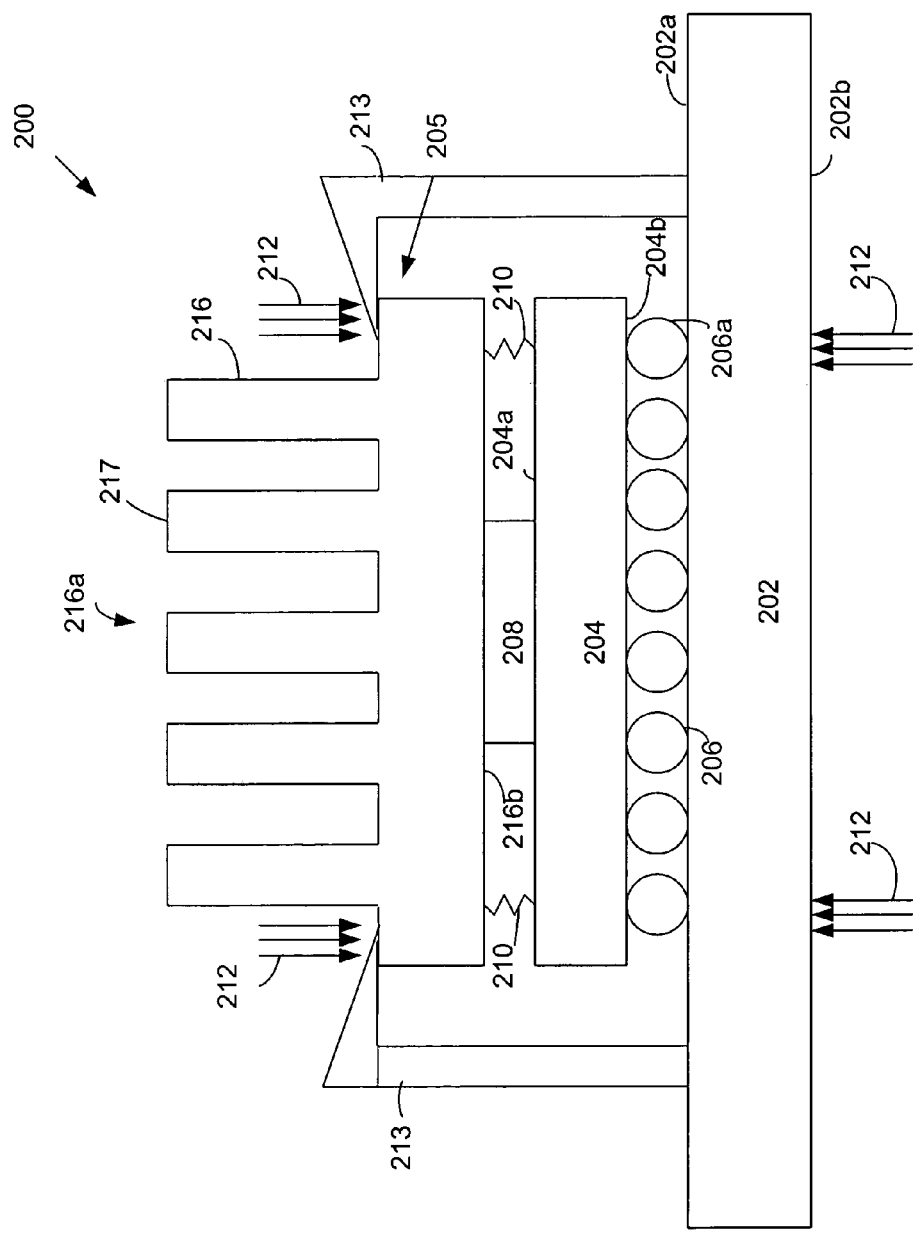

A heat dissipating device 216, that may include but is not limited to a heat slug, a heat sink, and/or a heat pipe, as are well known in the art, may be mounted to the microelectronic device 208 (FIG. 2b). The heat dissipating device 216 may comprise a first side 216a, which may include a plurality of projections 217, and a second side 216b. The heat dissipating device 216 may further comprise at least one spring mechanism 210, that may comprise a spring for example, or various other types of mechanisms as are known in the art that may function to spring load, or apply a force 212, such as a compressive force to the package 204.

The spring mechanism 210 may be attached to the second side 216b of the heat dissipating device 216 and to the first side 204a of the package 204. A retention module 213, as is known in the art, may attach to the heat dissipating device 216 and to the substrate 202, and may further serve to clamp down (i.e. apply a compressive force) and/or maintain the desired position of the heat dissipating device 216 with respect to the package 204 and the substrate 202.

Figure 2C:
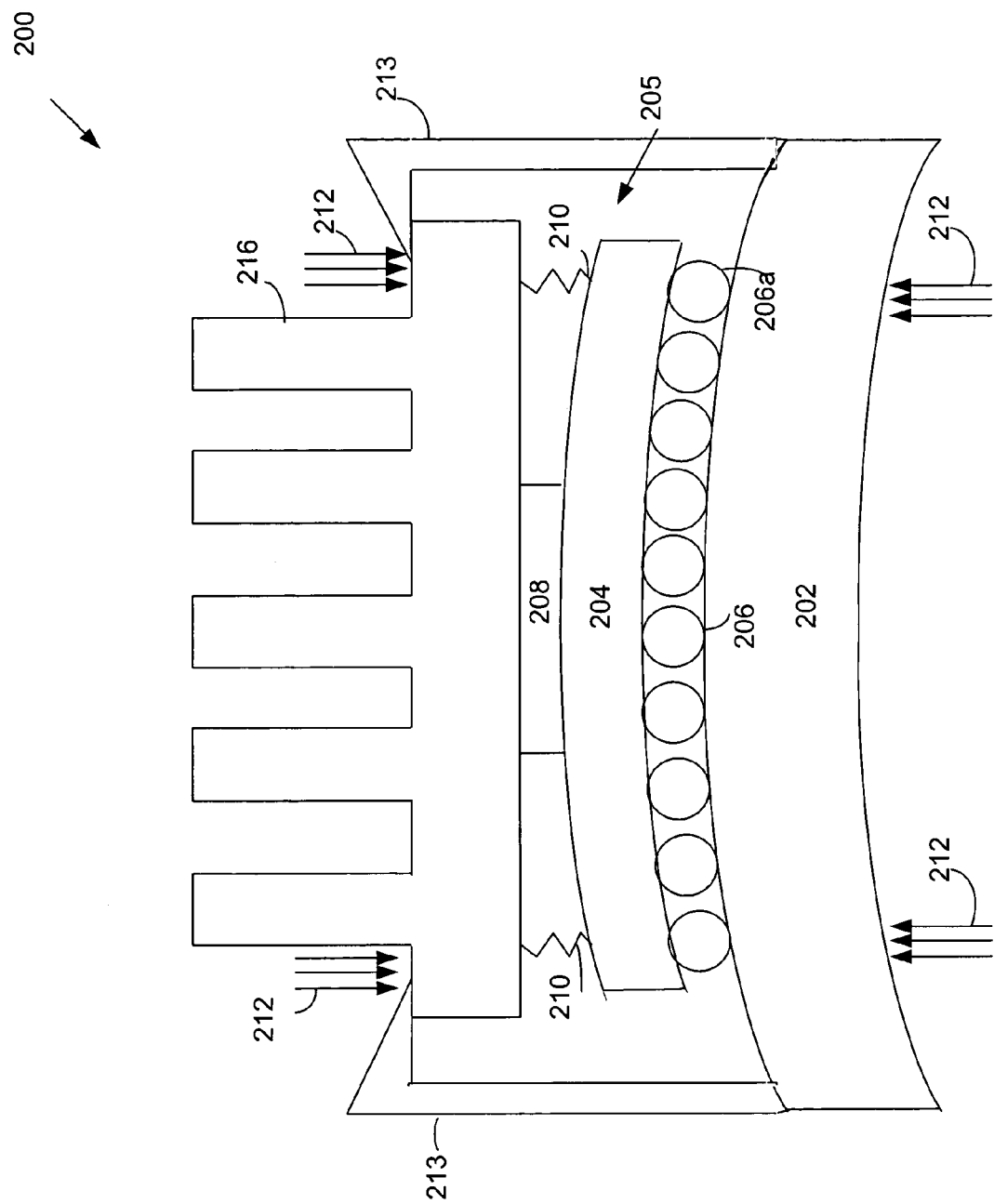

During flexure of the substrate 202 (that may be caused by assembly, and/or handling, for example) the flexure may induce forces, such as tensile and/or shear forces, upon the corner interconnects 206a in the weak area 205 of the package 204 (see FIG. 2c). By spring loading the package 204 with the spring mechanism 210 of the heat dissipating device 216, the induced forces from the substrate 202 flexure may be reduced and/or eliminated, since the applied compressive force 212 may counteract the flexure induced forces that may be experienced by the package 204 and the interconnects located near the weak area of the package.

Figure 2D:
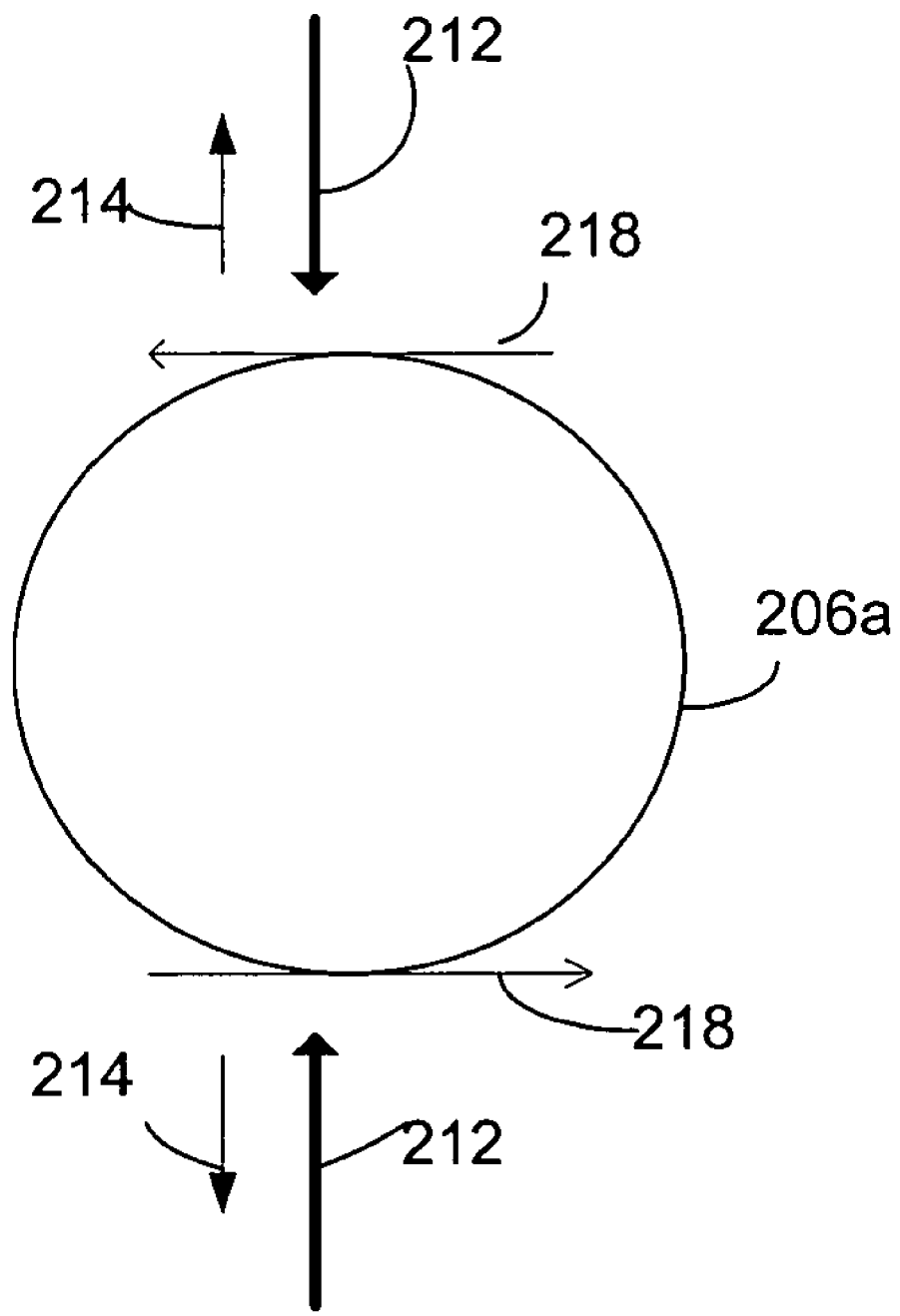

FIG. 2d depicts a corner interconnect 206a after flexure according to the current embodiment of the present invention The induced forces that may be experienced by the interconnect during flexure may include a tensile force 214 and/or a shear force 218, as depicted in FIG. 2d. The magnitude of the force 212 may be chosen such that it reduces and/or eliminates the induced flexure forces, but is not of such a magnitude that the force 212 itself causes failure in the interconnects 206. The particular magnitude of the force 212 may be tailored for the particular application parameters.

Figure 3:
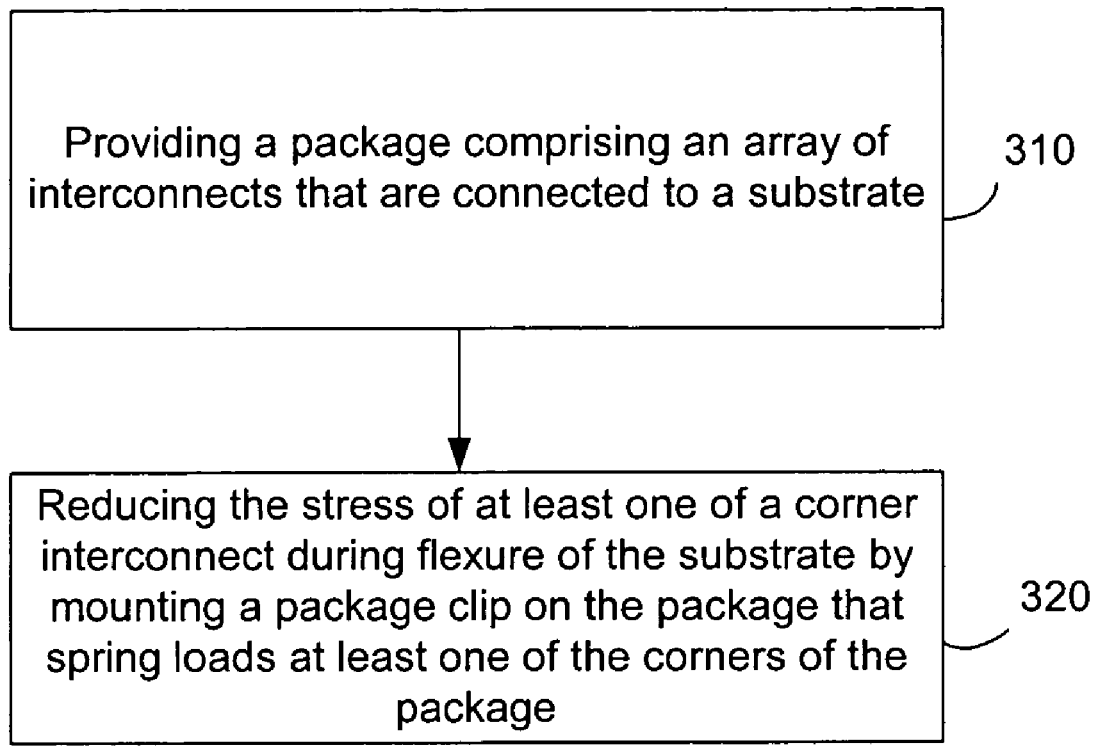
FIG. 3 represents a flowchart of a method according to an embodiment of the present invention.

FIG. 3 depicts a flow chart of a method according to an embodiment of the present invention. At step 310, a package is provided that comprises an array of interconnects that are connected to a substrate. At step 320, the stress of at least one of a corner interconnect during flexure of the substrate is reduced by mounting a package clip on the package that spring loads at least one of the corners of the package. In this manner, the induced forces from the substrate flexure (during assembly and/or handling, for example) may be reduced and/or eliminated.

Figure 4:
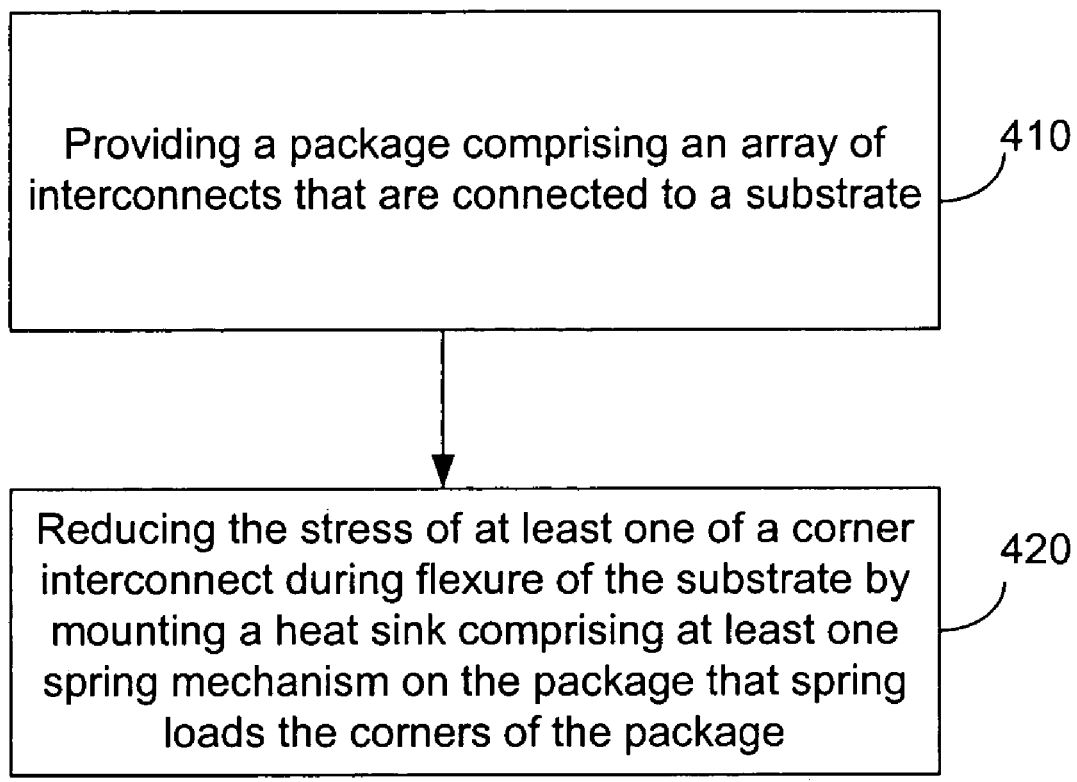
FIG. 4 represents a flowchart of a method according to an embodiment of the present invention.
Figure 5A:
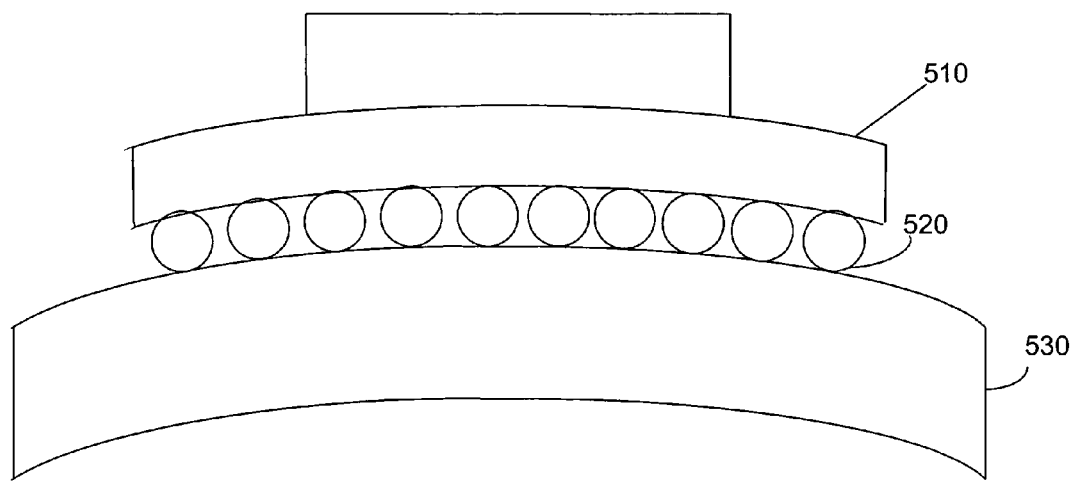
FIGS. 5a–5b represent structures from the Prior Art.
Figure 5B:
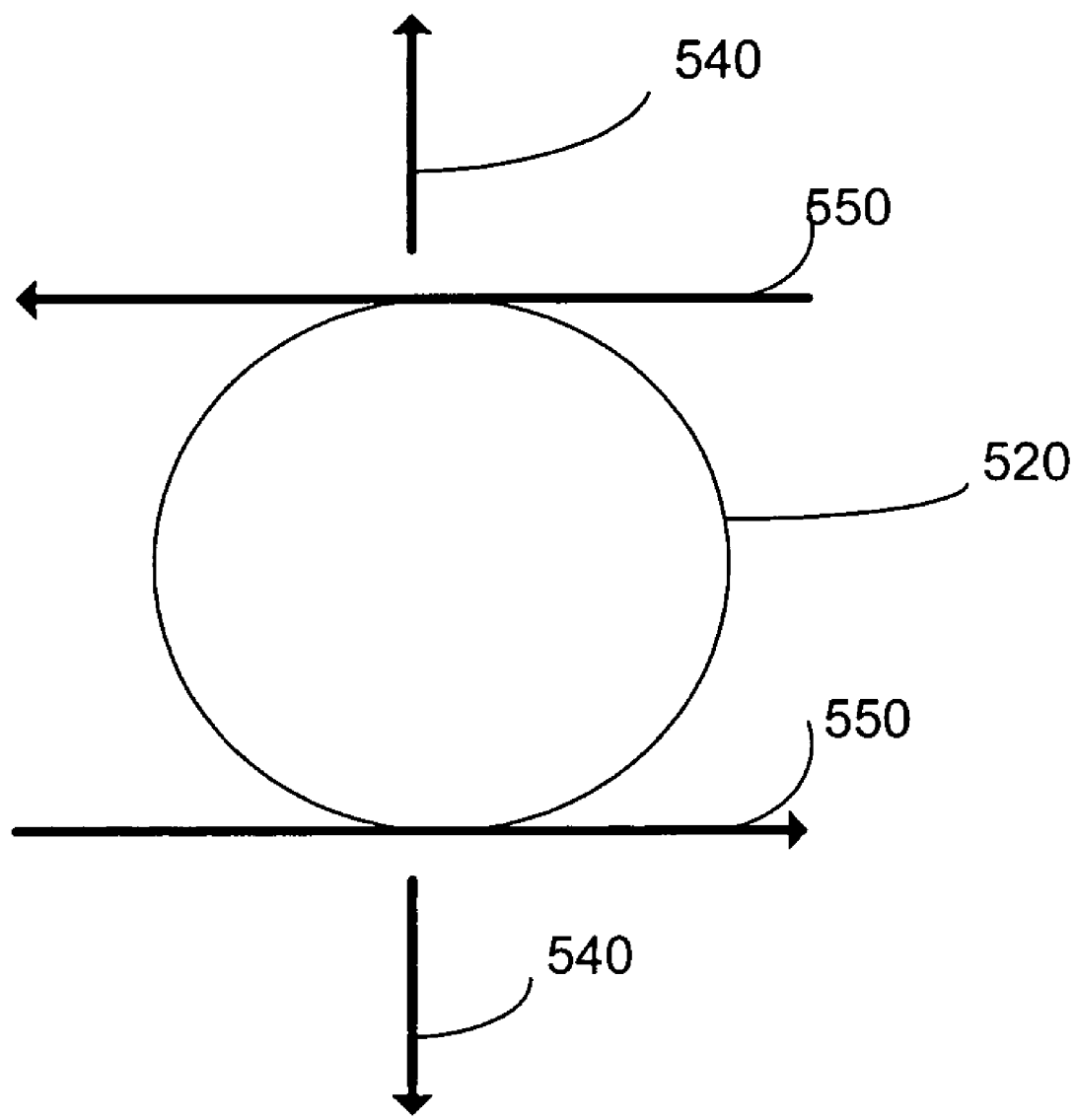

FIG. 4 depicts a flow chart of a method according to another embodiment of the present invention. At step 410, a package is provided that comprises an array of interconnects that are connected to a substrate. At step 420 the stress of at least one of a corner interconnect is reduced during flexure of the substrate by mounting a heat dissipating device comprising at least one spring mechanism on the package that spring loads at least one of the corners of the package. In this manner, the induced forces from the substrate flexure (during assembly and/or handling, for example) may be reduced and/or eliminated.

As described above, the present invention provides methods and associated apparatus of reducing the stress experienced by an interconnect located near a weak area (such as a corner) of a package during flexure of the substrate it is mounted thereon, by spring loading the weak area of the package. In this manner, mechanical failure of BGA interconnects located in the weak areas of the package may be reduced and/or eliminated.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that a package, such as may be found in a printed circuit board, is well known in the art. Therefore, it is appreciated that the Figures provided herein illustrate only portions of an exemplary package assembly that pertains to the practice of the present invention. Thus the present invention is not limited to the structures described herein.

What is claimed is:

1. A structure comprising:
    a package comprising an array of interconnects that are connected to a substrate;
    a spring loading mechanism mounted to the package that is capable of reducing the stress of a weak area of the package during flexure of the substrate, wherein the spring loading mechanism is disposed on at least one of a corner area of the package and is not substantially disposed above a center portion of the package.

2. The structure of claim 1 wherein the weak area comprises at least one of a corner of the package.

3. The structure of claim 1 wherein the spring loading mechanism comprises a package clip that is capable of applying a compressive force on at least one of a corner interconnect during flexure of the substrate.

4. The structure of claim 3 wherein the package clip comprises a compressive force that reduces a tensile force induced on the at least one corner interconnect during flexure of the substrate.

5. The structure of claim 3 wherein the package clip comprises a compressive force that reduces a shear force induced on the at least one corner interconnect during flexure of the substrate.

6. The structure of claim 1 wherein the spring loading mechanism comprises a retention module of a spring loaded heat dissipating device that is capable of applying a compressive force on at least one of a corner interconnect during flexure of the substrate.

7. The structure of claim 6 wherein the spring loaded heat dissipating device comprises at least one of a heat sink, heat slug and heat pipe.

8. The structure of claim 6 wherein the retention module comprises a compressive force that reduces a tensile force induced on at least one of the corner interconnects during flexure of the substrate.

9. The structure of claim 6 wherein the retention module comprises a compressive force that reduces a shear force induced on at least one of the corner interconnects during flexure of the substrate.

10. A method of reducing stress in a package comprising:
    providing a package comprising an array of interconnects that are connected to a substrate;
    reducing the stress of at least one of a corner interconnect of the package during flexure of the substrate by spring loading at least one of the corner interconnects of the package by mounting a package clip on the package that spring loads at least one of the corners of the package; and not substantially spring loading a center portion of the package.

11. The method of claim 10 further comprising wherein the package clip applies a compressive force on at least one corner interconnect.

12. The method of claim 11 further comprising wherein the package clip applies a compressive force on the at least one corner interconnect that reduces a tensile force that is induced in the at least one corner interconnect during flexure of the substrate.

13. The method of claim 11 further comprising wherein the package clip applies a compressive force on the at least one corner interconnect that reduces a shear force that is induced in the at least one corner interconnect during flexure of the substrate.

14. A method of reducing stress in a package comprising:
    providing a package comprising an array of interconnects that are connected to a substrate; and
    reducing the stress of at least one of a corner interconnects of the package during flexure of the substrate by spring loading at least one of the corner interconnects of the package by mounting a heat dissipating device to a microelectronic device disposed on the package, wherein the heat dissipating device comprises at least one spring mechanism that is capable of spring loading at least one of the corners of the package, and wherein a retention module disposed on the heat dissipating device is capable of applying a compressive force to the spring mechanism and is not substantially disposed above the center portion of the package; and
    not substantially spring loading a center portion of the package.

15. The method of claim 14 further comprising wherein the at least one spring mechanism applies a compressive force on at least one of the corner interconnects located in a weak area of the package.

16. The method of claim 15 further comprises wherein the at least one spring mechanism applies a compressive force on at least one interconnect located in the weak area of the package that reduces a tensile force that is induced in the at least one interconnect located in the weak area of the package.

17. The method of claim 16 further comprises wherein the at least one spring mechanism applies a compressive force on at least one interconnect located in the weak area of the package that reduces a shear force that is induced in the at least one interconnect located in the weak area of the package.

* * * * *